(12) United States Patent
Reichenthal (10) Patent No.: US 7,058,558 B2
(45) Date of Patent: Jun. 6, 2006

(54) SIMULATION SYSTEM AND METHOD

(75) Inventor: Steven W. Reichenthal, Yorba Linda, CA (US)

(73) Assignee: The Boeing Company, Seattle, WA (US)

(*) Notice: Subject to any disclaimer, the term of this patent is extended or adjusted under 35 U.S.C. 154(b) by 881 days.

(21) Appl. No.: 09/865,293

(22) Filed: May 25, 2001

(65) Prior Publication Data

US 2003/0028863 A1    Feb. 6, 2003

(51) Int. Cl.
*G06F 17/50* (2006.01)

(52) U.S. Cl. .................................. 703/17; 715/513
(58) Field of Classification Search .............. 703/4, 703/13, 17; 717/104, 114, 138
See application file for complete search history.

(56) References Cited

U.S. PATENT DOCUMENTS

| 6,732,330 B1* | 5/2004 | Claussen et al. ............ 715/513 |
| 6,778,863 B1* | 8/2004 | Lienhard et al. ............. 700/32 |

OTHER PUBLICATIONS

Miller et al, "JSIM: A Java-Based Simulation and Animation Environment," Proceedings of the 30th Annual Simulation Symposium, Atlanta, Georgia, Apr. 1997, pp. 31-42.*

Huang et al, "Building a Web-Based Federated Simulation System with Jini and XML," Proceedings of the 34th Annual Simulation Symposium, Seattle, Washington, Apr. 2001, pp. 143-150.*

Miller et al, "Component-Based Simulation Environments: JSIM as a Case Study Using Java Beans", Proceedings of the 1998 Winter Simulation Conference, pp. 373-381.*

Miller et al, "Finding a Substrate for Federated Components on the Web", Simulation Conference Proceedings, 2000. Winter, vol.: 2, Dec. 10-13, 2000 pp.: 1849-1854.*

Miller et al, "Querying XML Documents" Potentials, IEEE, vol.: 19, Issue: 1, Feb.-Mar. 2000 pp.:24-26.*

* cited by examiner

*Primary Examiner*—William Thomson
*Assistant Examiner*—Tom Stevens
(74) *Attorney, Agent, or Firm*—Ostrager Chong Flaherty & Broitman P.C.

(57) ABSTRACT

A simulation system and method enabled through the use of an XML-based Simulation Reference Markup Language (SRML) and a corresponding system runtime environment. The simulation system comprises a simulation reference simulator adapted to receive an SRML simulation model including a simulation item. The simulation reference simulator comprises an item manager for loading properties of each item of the simulation model, and an event manager for processing the simulation model. A method of conducting simulations comprises the steps of defining a simulation model with Simulation Reference Markup Language, communicating the model to a simulation reference simulator, executing the model with the simulation reference simulator, and providing an output of the modeled events.

24 Claims, 4 Drawing Sheets

SIMULATION SYSTEM AND METHOD

This invention was made with Government support under Contract No. HQ0006-01-C-0001 awarded by the Department of Defense. The government has certain rights in this invention.

TECHNICAL FIELD

The present invention relates generally to computer-implemented simulation systems and methods, and more particularly, concerns an XML-based simulation system and method.

BACKGROUND OF THE INVENTION

Simulation is a process that attempts to predict aspects of the behavior of some system by creating an approximate, typically mathematical, model of the system. Computers provide an ideal environment for building simulations. Generic simulators have many uses. For example, businesses use simulations to develop optimized processes such as staffing decisions or inventory management. Simulations also lower the risks associated with critical decisions by enabling analysis of influences to a system output. Engineers also use simulations to prototype and test designs.

Simulations, however, require an investment in tools, time, and people. Simulation tools can include spreadsheets, programming languages, and full-featured commercial simulation packages. Each of the currently available simulation tools has associated tradeoffs. Spreadsheets, for example, offer low purchase cost, but limited built-in functionality. Similarly, traditional programming languages provide maximum flexibility, but can require more time and skill to maintain and operate. Both spreadsheets and programming languages can require extensive programming, and spreadsheets can be too slow for complex situation modeling where thousands of items are required to be simulated. General-purpose commercial simulation tools provide sophisticated built-in capabilities combined with graphical development environments, which may save time, but can be very expensive. The initial price of general-purpose commercial simulation tools and/or licenses for such tools can run into the tens of thousands of dollars per year. Such commercial tools exist for specific applications such as supply chain management, resource management, manufacturing, and science.

All of these simulation tools have additional drawbacks. For instance, tool vendors can go out of business or be purchased by larger firms who significantly modify or discontinue a product line. The simulation tools may also not scale to handle highly sophisticated business processes. As well, the programming languages underlying the tools can be obscure such that the learning curve becomes high, and only a few people within a given organization become skilled in their use. Another drawback to currently available simulation tools is that there are no widely adopted standards for interchanging simulations developed in different tools, making it difficult to reuse simulation models. Conventional simulation tools that support parallel processing or distribution are often not general-purpose, are very expensive, or require extremely advance programming in order to realize their potential. Additionally, without simulation support software, simulations developed in programming languages can lead to awkward programming. Even with a simulation engine, however, programming language solutions usually do not provide a natural way of describing hundreds or thousands of inter-connected objects of various types. Using traditional database management systems to store objects typically leads to simulations that run too slowly for practical use.

Simulations themselves also pose computing challenges. For example, simulations typically need to represent large numbers of inter-related objects in relationship to each other, and need to manipulate these objects at high speeds. Thus, unlike a traditional business program, a simulation may require a large amount of computing speed and memory. Due to the iterative process of simulation, modelers and other users need a way to easily repeat a simulation run with varying random number seeds and must be able to combine the results. Likewise, modelers need the ability to repeat simulation runs while systematically varying one or more parameters. Users of simulations also desire the ability to watch, freeze, reverse, and snapshot a simulation.

Thus, there exists a need for a low cost, easy to program, platform-independent, reusable, standards-based, and graphics-based simulation system and method.

DISCLOSURE OF THE INVENTION

Accordingly, an object of the present invention is to provide an improved simulation system and method.

According to the present invention, the foregoing and other objects and advantages are obtained by a simulation system and method, which is enabled through the use of an XML-based Simulation Reference Markup Language (SRML) and a corresponding system runtime environment.

The present invention provides a simulation system comprising a simulation reference simulator adapted to receive an SRML simulation model including a simulation item. The simulation reference simulator comprises an item manager for loading properties of each item of the simulation model, and an event manager for processing the simulation model.

The present invention also discloses a method of conducting simulations comprising the steps of defining a simulation model with Simulation Reference Markup Language, communicating the model to a simulation reference simulator, executing the model with the simulation reference simulator, and providing an output of the modeled events.

An advantage of the present invention is that it provides a low cost, easy to program simulation scheme. Another advantage is that the present simulation scheme is platform-independent, reusable, and standards-based.

Other objects and advantages of the invention will become apparent upon reading the following detailed description and appended claims, and upon reference to the accompanying drawings.

BRIEF DESCRIPTION OF THE DRAWINGS

For a more complete understanding of this invention, reference should now be made to the embodiments illustrated in greater detail in the accompanying drawings and described below by way of examples of the invention.

In the drawings.

DETAILED DESCRIPTION OF THE INVENTION

The simulation system and method described herein is enabled through the provision of an XML-based development program referred to as the Simulation Reference Markup Language (SRML) and its corresponding runtime environment including a Simulation Reference (SR) Simulator.

Figure 1:
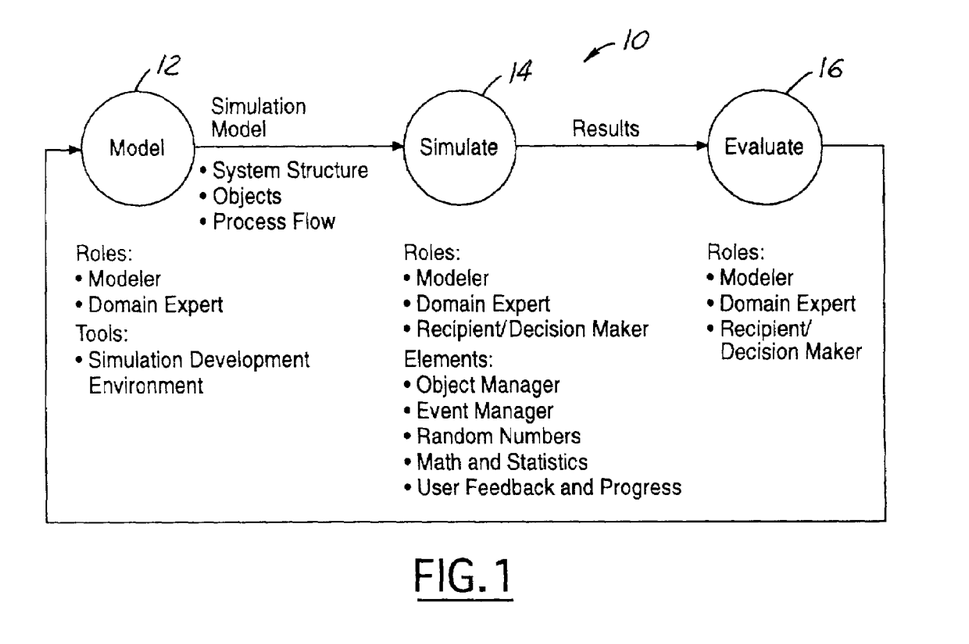
FIG. 1 is a schematic diagram of a general simulation process.

Referring to FIG. 1, there is shown a schematic diagram of a general simulation process 10. In general, simulation follows a three-step process that follows the sequence of developing a desired model 12, running the simulation 14, and evaluating the simulation outcome 16. Each step in the process can involve several different types of personnel who can be classified as modelers, domain experts, and recipients/decision makers. Modelers and domain experts build models using a tool known as a simulation development environment. The tool generates and stores a representation of the model that is fed into a simulation engine. The simulation engine manages objects, events, mathematical and statistical calculations, and random number generation to actually run the simulation. The simulation engine also typically provides feedback to a user about the simulation progress, as running a simulation may take more than a few seconds. Once the simulation is completed, modelers, domain experts and decision makers can evaluate the results, and often will use the results in the construction of a new model. In this regard, the general simulation process usually follows an ongoing iterative methodology.

The drawbacks associated with spreadsheets, programming languages, and commercially available simulation packages outlined above, are overcome through the provision of the SRML described herein. SRML is an Extensible Markup Language (XML) application that provides a way of describing a simulation. The SR Simulator described herein is a tool that reads the XML input that conforms to the SRML schema, builds script-based items corresponding to each of the elements, and executes events scheduled by those items. The SRML modeling tool is therefore a programming method that allows a modeler to create and edit SRML simulations.

The SRML and SR Simulator are based upon XML because XML technologies are well-suited to both represent and execute simulations. XML has enough expressiveness to describe data objects at various levels of complexity. Through the use of schemas, XML also provides structural document validation and data typing. XML can also be easily transported in a human readable form and can easily describe hierarchical structures and linked networks. Once loaded, XML data can also be queried in a fashion similar to a database. XML editors and tools that read and write XML are also inexpensive or free.

XML is a metalanguage—it is a language for describing other languages. It is designed to enable the use of the Standard Generalized Markup Language (SGML) defined in ISO Standard 8879:1986 that is designed to make ift easy to define descriptions of the structure and content of different types of electronic documents over the Internet. SGML and XML are markup specification languages with which a user can design ways of describing information, usually for storage, transmission, or processing by a program. XML is based on the concept of documents composed of a series of objects (entities). Each object can contain one or more logical elements. Each of these elements can have certain attributes (properties) that describe the way in which the element is to be processed. XML provides a formal syntax for describing the relationship between the objects, elements and attributes that makeup an XML document which an be used to tell a computer how it can recognize the component parts of each document. To allow a computer to validate the structure of a document, a user must provide the computer with a Document Typed Definition (DTD), or an XML Schema Definition (XSD) schema, or an XML Data Reduced schema that declares each of the permitted objects, elements and attributes and the relationships between them.

XML's declaration syntax requires that elements and their attributes be entered between matched pairs of angle brackets (< . . . >), while object references start with an ampersand and end with a semi-colon (& . . . ;). Similarly, the start and end of each logical element of a file must be clearly identified by a start tag (e.g. < to >) and an end tag (e.g. </ to >). Text or additional markup can exist between the start tag and the end tag for a given element. Thus, elements can have both attributes (described by name-value pairs), and can contain embedded elements.

XML is not a programming language, so XML files do not "run" or "execute." Rather XML is a markup specification language and XML files are data: a program must be run which displays the files (like a browser) or does some work with them (like a converter which writes the data in another format, or a database which reads the data), or even creates them (like an editor).

These XML constructs form a structure for describing any kind of hierarchically related discrete data. An XML schema permits a modeler to specify rules about element relationships and attributes that can be validated with software. The XML Document Object Model (DOM) is an Application Programming Interface (API) that enables programming languages and scripts to load, validate, navigate, modify, and save XML structures with code. DOM software implements elements and attributes with linked node objects.

The SRML described herein enables a modeler to describe information in a class of documents specifically designed for simulations. SRML organizes XML in a way that makes it practical to represent large numbers of interconnected numbers both hierarchically and networked, as well as individual item behavior by way of scripts. SRML also permits item classes, polymorphism, and multiple-inheritance. SRML also enables synchronous, asynchronous, and scheduled communications as well as random events.

Figure 2:
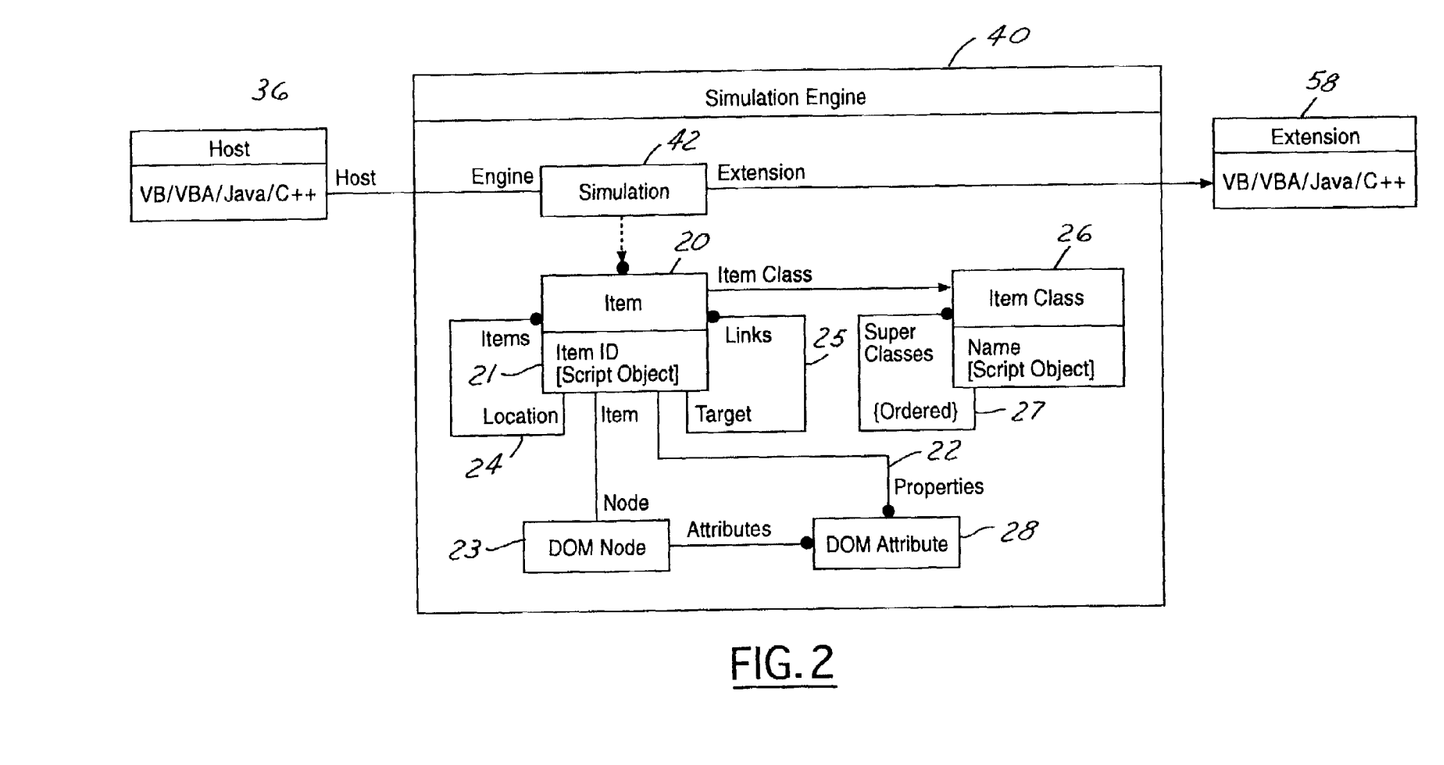
FIG. 2 is a schematic diagram of a simulation runtime environment including an item within a simulation according to one embodiment of the present invention.

Referring now to FIG. 2 there is shown a schematic diagram of a simulation runtime environment including an item within a simulation according to an embodiment of the present invention. The things described when modeling in SRML are referred to as "items." An item 20 can represent a physical thing, such as a piece of equipment, or a person or an entire system of other items. An item may also represent a process or a step in a process. Items can have properties 22. For example, a piece of equipment may have a "serial number" property, or a process may have a "duration" property. SRML provides a way to express items, their properties and complex item relationships, using the grammar of XML with a small set of predefined elements and attributes that have specific meanings and rules. An example of a general structure of a simulation in SRML appears as follows:

```
<Simulation>
    <!-- Main Script - the following element defines the
behavior for the entire simulation -->
    <Script Type='script-language'>
        code
    </Script>
    <ItemClass Name='itemclassname1' SuperClasses=
'itemclass1 itemclass2 ...' property1='value1' ...>
        <!-- The following element defines the behavior for
the class; not individual instances -->
        <Script Type='script-language'>
            code
        </Script>
        <!-- The following element defines the prototype for
the instances -->
        <itemclassname1 property1='value1' ...>
            <!-- The following element defines the
behavior for the instances -->
            <Script Type='script-language'>
                code
            </Script>
        </itemclassname1>
    </ItemClass>
    <ItemClass Name='itemclassname2' ...>
        ...
    </ItemClass>
    <itemclassnameA Name='itemname1' Quantity='number'
property1='value1' ...>
        <Link Name='linkname1' Target='query' />
        <Link .../>
        <Links Name='linksname1'>
            <Link Name='linkname2' Target='query'>
                ...
        </Links>
        <Script Type='script-languaqe'>
            code
        </Script>
        <itemclassnameB Name='itemname'>
            ...
        </itemclassnameB>
    </itemclassnameA>
    <itemclassnameC ...>
        ...
    </itemclassnameC>
</Simulation>
```

Items and properties in SRML correspond to elements and attributes in XML. Thus, items are derived from the elements, and properties are derived from the attributes. With the exception of a few predefined element names such as ItemClass, SRML uses the elements and attribute names defined by the modeler. This makes it possible to create a domain-specific XML schema to validate a system's structure and to provide data types for the attributes. A domain-specific schema works in conjunction with the SRML schema when using XML namespaces.

Referring again to FIG. 2, internally each item 20 has a unique system-generated ItemID 21 and an associated Script. Each item 20 has an association with a DOM node 23 from the element. The item 20 can both serve as a location 24, and belong at a location along with other items. An item can also have links 25 to other items and be a target for a link. Also, an item can belong to an item class, which in turn, can belong to a superclass 27. The item 20 gets its properties 22 directly from DOM attributes 28, and its behavior from a script. The item class element 26 allows a modeler to generalize groups of common items, however an item does not need to have a corresponding item class.

An item's behavior is provided inside a script element using either JavaScript or VBScript, and by specifying the Type attribute as either "text/java script" or "text/vbscript." The following is an example of an item that is defined with a script:

```
<Vehicle ID='Airforce1' Running='1'>
    <Script Type='text/javascript'>
    <![CDATA[
    var Occupied=0;
    function turnOn( )
    {
        Running=1;
    }
    function turnOff ( )
    {
        Running =0;
    }
    ]]>
    </Script>
</Vehicle>
```

The Vehicle item is given a unique system-wide identifier since an ID property has global semantics, and a Running property with an initial value of "1." In general, the script directly accesses DOM attributes to obtain properties. However, the script can define properties that do not have corresponding attributes by declaring public variables. In this example, the item's behavior also comes by way of functions, which are identified as "turnOn" and "turnOff." Because the foregoing script defines AirForce1 as having a global identifier, anywhere in the script, a modeler could use a code such as the following:

AirForce1.Occupied=1;

AirForce1.turnOn( );

X=AirForce1.Running

AirForce1.turnOff( );

Each item has a certain number of intrinsic properties. For example, every item has a "location" property that refers to its current location. In most instances, an item's location refers to another item, however an item's location can be "nothing" or "undefined" which means that it either does not exist in the model or is at the top of the location tree. Each item also has an item's collection that holds the references to all of the items it contains.

Item quantities can also be defined for situations wherein a large quantity of a particular item or structure is desirable. Specifically, within any element, SRML can be provided with a "Quantity" attribute. The quantity attribute instructs an SRML simulator to duplicate the element and its contents. For example, the following structure defines a total of 240 eggs in a total of 20 egg cartons in two refrigerators.

```
<Refrigerator Quantity='2'>
    <EggCarton Quantity='10'>
        <Egg Quantity='12' />
    </EggCarton>
</Refrigerator>
```

SRML also provides two linking mechanisms. The first linking mechanism allows a modeler to use the "Link" element to provide the name and an XPath expression to identify the target. The second mechanism allows a modeler to use the "Links" element to provide a name and supply interlinks. When a schema is used and attributes of the type IDREF or IDREFS are provided, SRML treats them in the same way it treats links.

Items have other built-in properties beside the Location and Items properties. When the SR Simulator creates an item as described below, it automatically assigns a unique numeric value to the item's "ItemID" property. This property can then be used to uniquely identify the item in the presence or absence of an explicit ID attribute. Items also have a language neutral "Self" property that refers to a particular item instance in which a script is running. Also, an item's "Events" collection contains references to all the events scheduled or posted for that item. This characteristic makes it easy at runtime to find and possible alter previously scheduled events. In addition, as a simulation runs, the scripts operate directly on the underlying DOM nodes as they alter item properties and locations. Therefore, each item has a "Node" property that returns its corresponding Node. Moreover, each item also contains a reference to its item class by way of its "ItemClass" property. Shared properties and behaviors can be added to a specific item class in the same way they are added to regular items.

SRML also allows items to be moved. The static structure of a model represents inner-connected items at a particular point in time. As a simulation progresses, however, an item may need to be moved to a different location. This is done by simply assigning the Location property to a different item. For example, with JavaScript, the following code moves Vehicle99 to Alaska.

Vehicle99.Location=Alaska

Items can also have fixed location properties. Some items, such as geographical locations, for example, may have their locations fixed for an entire simulation. When an item has a unique name within its containing locations, such as California within the United States, SRML makes it directly accessible by specifying a LocationFixed='True' attribute.

```
Sites.xml:
<Location ID='World' LocationFixed='True'>
    <Location Name='USA' LocationFixed='True'>
        <Location Name='California' LocationFixed='True'>
            <Location Name='Anaheim' LocationFixed='True'>
                <Vehicle Name='Truck' Quantity='100' />
            </Location>
        </Location>
    </Location>
</Location>
```

Thus, somewhere in a script, the first Truck in Anaheim within the World may be addressed by the following syntax:

World.USA.California.Anaheim.Items(1)

SRML also allows a user to find items that meet certain criteria. This is accomplished by providing an XPath expression to the FindItems function, which will return a collection of items that were found.

SRML also provides for event scheduling. Typically, items modeled correspond to physical things such as people, the weather, the ocean, mechanical devices, or electronic circuits. Items such as these can both send and receive stimulus to and from other items. The SRML runtime environment provides four procedures for sending synchronous, asynchronous, and scheduled events among objects. These procedures are: SendEvent, PostEvent, ScheduleEvent, and BroadcastEvent. Each of these procedures requires a target object, an event string, and any number of parameters. SendEvent sends the specified event immediately to the target object. PostEvent sends the event asynchronously to the target. ScheduleEvent takes the date-time parameter and sends the event at the specified time. BroadcastEvent sends the specified event to the specified number of target objects.

In a typical discrete-event simulation, many items will generate events autonomously. Since these items are linked to other items, communication proceeds naturally. SRML also allows for the simulation to generate metrics such as a count of an event of a certain type over a period of time, or a trace of those same events for example. SRML also allows the course of the simulation to change as the result of an event. This is accomplished by placing a Script element directly inside the Simulation object to create a 'mainscript' that can intercept every event in the simulation immediately after it occurs. Of course, the mainscript is optional; however, providing it allows a modeler to describe a completely self-contained simulation within the SRML. In the following example, the mainscript receives the "failed" and "repaired" events of the Motor item, after the Motor has received these events.

```
Motor1.xml:
<Simulation>
    <Script Type='text/javascript'>
    <![CDATA[
        var nFailures = 0;
        var nRepairs = 0;
        function Motor_failed(objLRU)
        {
            nFailures++;
        }
        function Motor_repaired(objLRU)
        {
            nRepairs++;
        }
    ]]>
    </Script>
    <Motor ID='MO293847' Operable='1'>
        <Script Type='text/javaScript'>
        <![CDATA[
            ScheduleEvent (this, "failed", DateAdd("h", Random( )*100, CurrentTime));
            function failed( )
            {
                Operable=0;
                ScheduleEvent(this, "repaired", DateAdd("h", Random( )*8, CurrentTime))
            }
            function repaired( )
            {
                Operable=1;
                ScheduleEvent(this, "failed", DateAdd("h", Random( )*100, CurrentTime))
            }
        ]]>
        </Script>
    </Motor>
</Simulation>
```

As noted above, SRML provides a generalization mechanism, which allows the creation of classes of items, in addition to providing specific attributes and behavior for individual items. The ItemClass attribute is similar to a class in object-oriented terms, in that it allows a modeler to describe the properties and behavior for its instances while also providing a type of inheritance. In SRML, any number of item classes in a model may be specified by using an ItemClass element and specifying a unique Name. Within the class, an instance prototype is also provided by embedding an element with a tag name that matches the Name attribute of the item class. This prototype can have attributes with default values and data types validated by an XML schema. The following is an example of a general form of an ItemClass for SRML:

```
<ItemClass Name='itemclassname1' SuperClasses='itemclass1
itemclass2...' property1='value1' ...>
    <!-- The following element defines the behavior for the
class; not individual instances -->
    <Script Type='script-language'>
code
    </Script>
    <!-- The following element defines the prototype for the
instances -->
    <itemsclassname1 property='value1' ...>
        <!-- The following element defines the behavior for
the instances -->
        <Script Type='script-language'>
code
        </Scrip>
    </itemclassname1>
</ItemClass>
```

As can be seen from the foregoing example, there exists a correspondence between the tag name of the prototype and the name property of the ItemClass.

SRML also allows for the provision of superclasses wherein a common set of properties and behaviors apply to more than one ItemClass. The superclass mechanism in SRML provides polymorphism, multi-inheritance, and overriding in both ItemClass instances and the ItemClass itself. SRML is different from traditional programming languages, however, in that the activity of walking up an inheritance chain to find an item's method is not provided for. Thus, overriding a method overrides its complete definition. In the example below, a Motor has two general superclasses: Assets and Operates. The SuperClasses attribute specifies the lowest of named item classes in descending priority.

```
Motor1.xml:
<Simulation>
    <Script Type='text/javascript'>
    <![CDATA[
        var nFailures = 0;
        var nRepairs = 0;
        function Motor_failed(objLRU)
        {
            nFailures++;
        }
        function Motor_repaired (objLRU)
        {
            nRepairs++;
        }
    ]]>
    </Script>
    <Motor ID='MO293847' Operable='1'>
        <Script Type='text/javascript'>
        <![CDATA[
            ScheduleEvent(this, "failed",
            DateAdd("h", Random( )*100,
            CurrentTime));
            function failed( )
            {
                Operable=0;
                ScheduleEvent(this, "repaired", DateAdd("h",
                Random( )*8, CurrentTime));
            }
            function repaired( )
            {
                Operable=;
                ScheduleEvent(this, "failed", DateAdd("h",
                Random( )*100, CurrentTime));
            }
```

```
        ]]>
        </Script>
    </Motor>
</Simulation>
```

Figure 3:
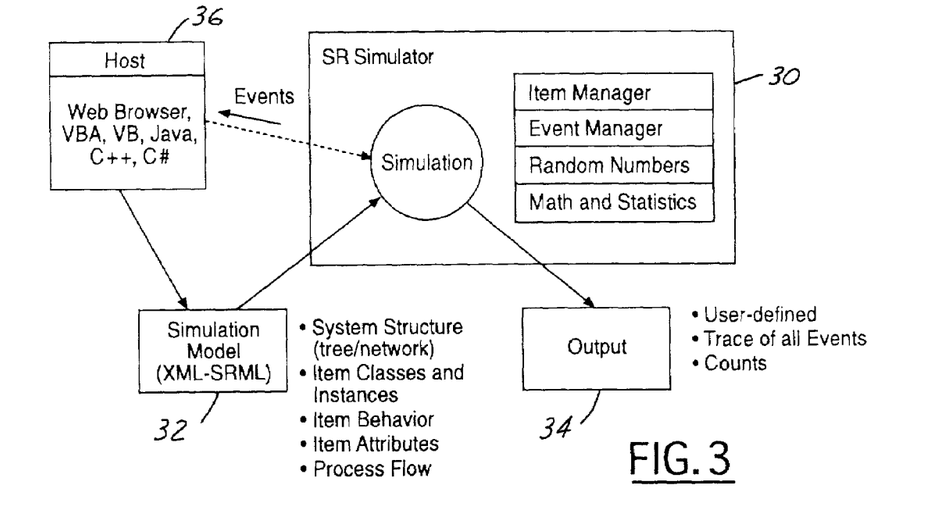
FIG. 3 is a schematic diagram of an environment wherein a Simulation Reference Simulator according to the present invention may operate.

In operation, the SRML is executed in a runtime environment. Referring now to FIG. 3, there is shown a schematic diagram of an environment in which the SR Simulator according to the present invention may operate. The SR Simulator 30 is a collection of software objects that can read SRML input from the simulation model 32, and, in turn, build and manage the corresponding simulation items, connect those items together and provide an event-driven mechanism for items to communicate. The SR Simulator 30 also provides simulation support in the form of a random number generator, simulation primitives such as time averages and data structures, math functions, statistical functions, and the ability to generate outputs 34 as defined by the stimulation model 32.

Simulations can run in many environments. For example, a simulation may run as part of a web page, as part of a spreadsheet, or embedded in a custom application. The SR Simulator 30 is a single software component that can support all of these environments for SRML. Thus, a modeler can choose any host environment 36 that is capable of creating a simulation object and using the host interface. Possible hosts include web browsers such as Microsoft Internet Explorer, Microsoft Office applications, Microsoft Visual Basic, and Java.

The host environment 36 preferably resides on a general purpose computer. The computer, thus, includes a processor; standard memory devices such as random access memory (RAM); an output device such as a CRT display and/or printer; an input device such as a keyboard and/or mouse; a network interface such as a standard Ethernet adapter; and a storage device such as a hard disk drive, CD-ROM, DVD, flash memory or other mass storage device. In such a case, the host environment, therefore, comprises the general-purpose computer specifically configured with any of the foregoing host programs.

Using the host environment, a modeler creates the desired simulation model 32 according to the SRML declaration syntax. Thus, the modeler defines the overall system structure using the Item and ItemClass definitions, and assigns behavior and attribute properties, if desirable, to each defined Item. In this way, the entire process flow is defined in the SRML format which is platform-independent and standards-based.

The SR Simulator 30 provides a class of Simulation objects. Each Simulation object encapsulates a simulation instance or run, and is primarily responsible for providing the runtime environment. The SR Simulator may be embodied in the same general-purpose computer as the host environment, or reside on a separate computer or network terminal. Similarly, the Simulation Model 32 and output 34 can also be embodied in the same computer or network terminal as the host environment 36 and SR Simulator 30. In addition, since a Simulation is an object that embodies a particular execution of a simulation, many simultaneous simulations can exist on the same computer, or be distributed across a network as a client or server.

Figure 4:
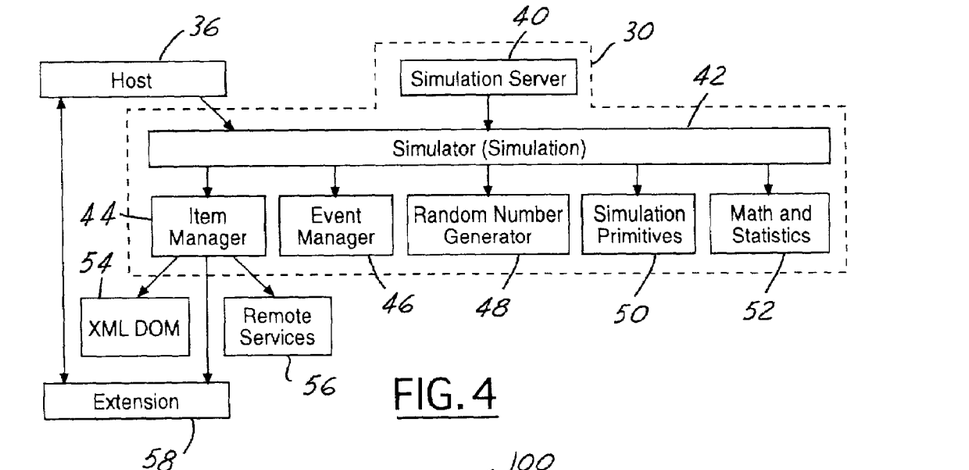
FIG. 4 is a schematic diagram of the architecture of a Simulation Reference Simulator and its associated environment according to one embodiment of the invention.

Referring now to FIG. 4, there is shown a schematic diagram of the architecture of a SR Simulator 30 and its associated environment. The SR Simulator includes a simulation server 40 and a simulation engine. A simulation server is a network-aware host application that takes requests from remote computers to load and execute simulations designated for the computer in which it resides. The simulation engine 42 receives the simulation model from the host 36 and manages the items 44 and events 46, and also provides functions for random number generation 48, simulation primitives 50, and mathematical and statistical functions 52 to carry out the simulation. Simulation primitives are a collection of standard simulation objects and methods to aid a modeler in building a simulation. These include objects such as queues, stacks and time averages, and in-memory databases. The math and statistics processor 52 can be a dedicated logic unit within the SR simulator 30 to provide these functions or software implemented functions executed by the simulation engine 42.

Figure 6:
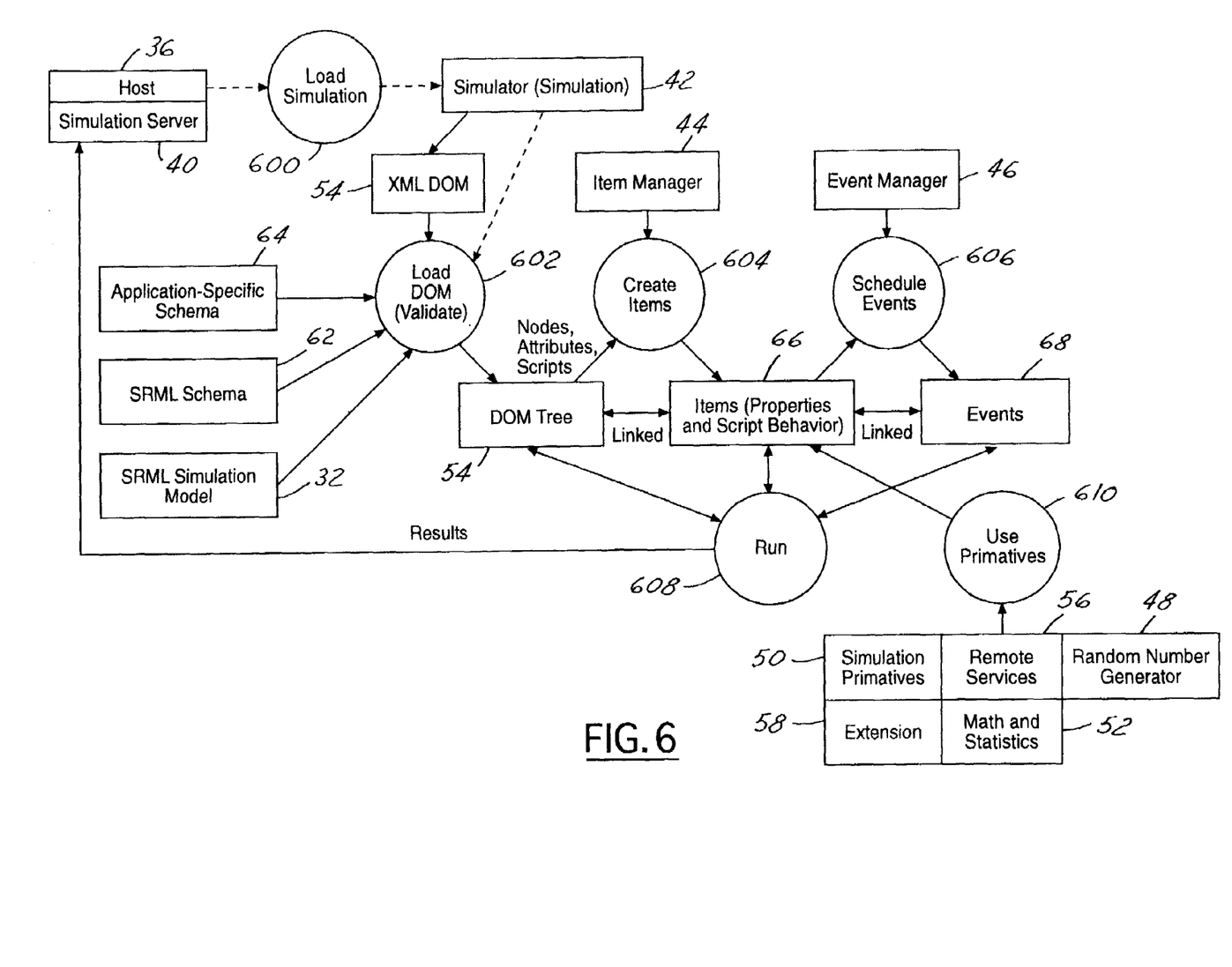
FIG. 6 is a schematic diagram of the functional flow of the operation of simulation system according to the present invention.

Referring now to FIGS. 4 and 6, the simulation loading process begins when a calling procedure invokes the Load (Step 600) method of a Simulation object and passes the location of the XML. At that point, the item manager 44 calls upon an XML parser to build a validated DOM tree 54 from the specified input (Step 602). If successful, the simulation then traverses the DOM tree and creates items 66 and schedules events 68 (Steps 604, 606) from the nodes, attributes, links and scripts contained therein. The nodes, attributes, links and scripts are supplied from the Model 32, SRML Schema 62, and application-specific schema 64. Code within an item's script that appears outside a function or procedure gets executed as the item is created as either a remote service 56 or extension 58. These are typically called by the simulation primitives (Step 610). Given that some items are loaded before others, this outer code has limited access to other items and follows specific rules of loading. In particular, an item can only access its Location property, its ItemClass property, any related SuperClasses, and the Simulation object. The item under consideration cannot access any sub-items, links, and any global items until after the load is complete. If an item requires further initialization, a modeler can broadcast a downward event from the root that invokes a specified initialization method.

Figure 5:
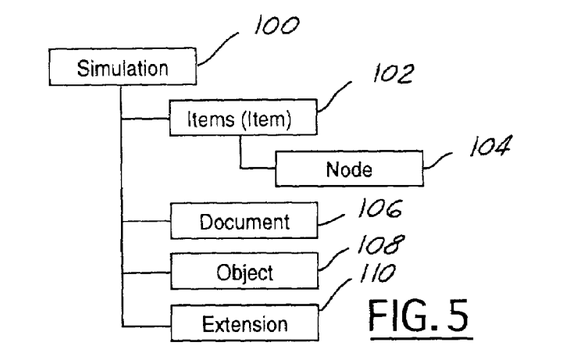
FIG. 5 is a schematic diagram of an object model associated with a simulation according to one embodiment of the present invention.

When the Load has completed, the simulation is ready to begin processing events, and a Simulation object is configured according to an object model as illustrated in FIG. 5. The scripts within every item in the simulation have access to the objects in this model. The simulation object model 100 includes a collection of all of the items 102 that link to their corresponding nodes 104. The simulation object model also includes a link to the XML DOM document 106, which allows the items to manipulate the DOM directly. The Simulation object's Object property 108 provides a virtual interface to the entire simulation runtime environment, and is useful to a host. A host can set an external Extension Object 110, and the Simulation object will map all of the Extension's properties and methods into the runtime environment as if they were intrinsic to the simulation.

Once the simulation has been loaded, the Simulation object can execute the model as individual steps or as a single run (Step 608). The execution of the simulation is governed by the event manager 46. To execute the model as individual steps, the commands DoNextEvent and ForwardLastEvent are initiated. The Run method is initiated to execute the model as a single run. In all cases, the Simulation object makes every event available to the host by either generating an EventOccurred event or by invoking the method in the host. The following example code shows an example run of a SR Simulator and Simulation from Microsoft Visual Basic for the example code Motor4.XML described above.

```
Private WithEvents Sim As Simulation
Private Sub Simulate( )
    Set Sim = CreateObject ("SR_Simulator.Simulation")
    Sim.RandomizeSeed
    Sim.Load App.Path & "Motor4.xml"
    Sim.CurrentTime = Now
    Sim.EndTime = DateAdd("yyyy", 1, Simulation.CurrentTime)
    Sim.Run Me, True
    Debug.Print "Failures " & Simulation.Object.nFailures
    Debug.Print "Repairs " & Simulation.Object.nRepairs
End Sub
```

Having described the behavior of SRML, Table 1 provides a list of the XML key words associated with SRML:

TABLE 1

XML keywords:

| Element | Type | Applies | Description |
| --- | --- | --- | --- |
| Item | Element | Globally | Defines an item. This is implied by elements in a domain-specific schema and need not be specified. |
| ItemClass | Element | Globally | Designates a class of items, which all have the same behaviors. |
| JavaScript or text/javascript | Value | Script Language or Type | Specifies that the script language for an item is JavaScript. |
| Link | Element | Items | Specifies a link (object reference) to another Item. |
| Links | Element | Items | Specifies a collection of individual links. |
| Location Fixed | Attribute | Item | Specifies that an item is fixed within its location. This makes the item directly accessible to the location through either its ID or it's Name whichever is specified first. If two items have the same ID or name, the last one will become the item that is directly accessible. For example if itemname is location fixed, then it can be accessed through location. itemname. |
| Name | Attribute | Items, ItemClasses | Designates the name for the Item or ItemClass. Name is required for an ItemClass, but not for an Item. |
| Quantity | Attribute | Items | Specifies the number of items to be constructed at the enclosing location. |
| Script | Attribute | Items, ItemClasses | Specifies the script, which defines the state and behavior for items. |
| Simulation | Object | Globally | This is the Simulation object. |
| Super Classes | Attribute | ItemClass | Specifies an ordered sequence of ItemClasses that provide default behavior for the ItemClass. An ItemClass specified to the left of another item class has higher priority. |
| Target | Attribute | Link | Specifies the target object of the link. |
| Type | Attribute | Script | Specifies the language that the script uses. The Language attribute is also allowed, however only one needs to be specified. |

TABLE 1-continued

XML keywords:

| Element | Type | Applies | Description |
|---|---|---|---|
| VBScript or text/vbscript | Value | Script Language or Type | Specifies that the script language is VBScript. |

Table 2 describes the intrinsic item properties and methods for SRML.

TABLE 2

Intrinsic Item properties and methods:

| Element | Type | Applies | Description |
|---|---|---|---|
| ItemID | Attribute | Item | Returns the unique identifier assigned to the item by the simulation when it was created. |
| Items | Collection | Item | Refers to the sub-items of the current item. |
| Location | Attribute | Item | Refers to another item that represents the current location of the item. |
| Self | Attribute | Item | Returns a reference to the current item. In JavaScript, the keyword 'this' may also be used. In VBScript, the keyword 'Me' may also be used. |
| Events | Collection | Item | Returns the events currently scheduled for an item. |
| Node | Attribute | Item | Returns the XML DOM node corresponding to the item. |
| ItemClass | Attribute | Item | Returns the ItemClass of the item. |

Table 3 describes the simulation runtime properties and methods for SRML.

TABLE 3

Simulation runtime properties and methods:

| Element | Type | Applies | Description |
|---|---|---|---|
| Run | Method | Simulation | Runs the simulation object. |
| Abort | Method | Simulation | Aborts the running simulation. |
| Schedule Event | Method | Simulation | Schedules an event. |
| Current Time | Property (read/write) | Simulation | Sets or returns the simulation's current time. |
| Destroy Item | Method | Simulation | Destroys an item. |
| Document | Method | Simulation | Returns the XML DOM document object. |
| DoNext Event | Method | Simulation | Sends the next scheduled or posted event to its target. |
| EndTime | Property (read/write) | Simulation | Sets or returns the simulation's end time. |
| Event Occurred | Event | Simulation | Indicates that an event occurred in the simulation. |
| Extension | Property (read/write) | Simulation | Sets or returns the simulation's extension object. This is used to allow items in the simulation to directly access the properties and methods of the extension object. |
| FindItems | Method | Simulation | Returns a collection of items found using the specified query. |
| Forward Last Event | Method | Simulation | Forwards the last event to the specified object. |
| GetItem | Method | Simulation | Returns the item with the specified ItemID. |
| Item | Method | Simulation | Returns the item with the specified ItemID. |
| ItemCount | Method | Simulation | Returns the number of items in the simulation. |

```
<!-- SRML 1.0 Schema
................................................... -->
<!-- file: SRML.xml
-->
<Schema xmlns="urn:schemas-microsoft-com:xml-data"
    xmlns:dt="urn:schema-microsoft-com:datatypes">
    <ElementType name='Script' content='textOnly'
        model='closed'>
        <AttributeType name='Language' dt:type='string' />
        <AttributeType name='Type' dt:type='string' />
        <attribute type='Language' default='VBScript' />
        <attribute type='Type' default='text/vbcript'/>
    </ElementType>
    <ElementType name='Link' content='mixed'>
        <AttributeType name='Name' dt:type='string' />
        <AttributeType name='Target' dt:type='string' />
        <attribute type='Name' required='yes' />
        <attribute type='Target' required='yes' />
    </ElementType>
    <ElementType name='Links' content='eltOnly'>
        <element type='Link' />
    </ElementType>
    <AttributeType name='Quantity' dt:type='i4' />
    <AttributeType name='LocationFixed' dt:type='boolean' />
    <!-- The reference element, Item, is defined here. -->
    <ElementType name='Item' content='mixed'>
        <AttributeType name='Name' dt:type='string' />
        <AttributeType name='ItemClass' dt:type='idref' />
        <attribute type='Name' required='no' />
        <attribute type='ItemClass' required='yes' />
        <attribute type='Quantity' required='no' default='1' />
        <attribute type='LocationFixed' required='no' />
        <element type='Script'/>
        <element type='Item' />
        <element type='Link' />
        <element type='Links' />
    </ElementType>
    <ElementType name='ItemClass' content='mixed' >
        <AttributeType name='Superclasses' dt:type='idrefs' />
        <AttributeType name='Name' dt:type='id' />
        <attribute type='Name' required='yes' />
        <attribute type='SuperClasses' required='no' />
        <element type='Script' />
        <element type='Item' />
        <!-- Prototype item is added here. -->
    </ElementType>
    <ElementType name='Simulation' content='mixed'>
        <element type='Script' />
        <element type='ItemClass' minOccurs='0' maxOccurs='*' />
        <element type='Item' minOccurs='0' maxOccurs='*' />
        <!-- Specific item elements may be added here. -->
    </ElementType>
</Schema>
<!-- end of SRML 1.0 Schema
................................................... -->
<!--
...................................................
............... -->
```

SR: The flowchart for the schema is the diagram that shows the item, DOM node, Item Class and associated relationships.

From the foregoing, it will be seen that there has been brought to the art a new and improved simulation system and method which overcomes the drawbacks associated with conventional simulations. While the invention has been described in connection with one or more embodiments, it will be understood that the invention is not limited to those embodiments. On the contrary, the invention covers all alternatives, modifications, and equivalence, as may be included within the spirit and scope of the appended claims.

What is claimed is:

1. A simulation system comprising:
   a simulation reference simulator (30) adapted to receive an SRML simulation model (32) which includes simulation behavior and structure of simulation items (20) contained therein by way of simulation specific scripts and markup, wherein said simulation reference simulator (30) responds to said simulation specific scripts and comprises:
   an item manager (44) for loading properties of each of said items (20) of the simulation model (32); and
   an event manager (46) for processing the simulation model (32).

2. The simulation system of claim 1 comprising a host (36) in operative communication with said simulation reference simulator (30) and including said SRML simulation model (32).

3. The simulation system of claim 1 wherein said simulation reference simulator (30) comprises a random number generator (48) in operative communication with said item manager (44) and event manager (46) for generating random numbers.

4. The simulation system of claim 1 wherein said simulation reference simulator (30) comprises means for processing mathematical and statistical functions (52), said means in operative communication with said item manager (44) and event manager (46) for generating random numbers.

5. The simulation system of claim 1 wherein said item manager (44) is in operative communication with an XML parser (54) for building a validated Document Object Model (DOM) tree in the process of loading said simulation items (20) of the simulation model (32).

6. The simulation system of claim 2 wherein said host comprises a general purpose digital computer including memory storing a host program.

7. The simulation system of claim 1 comprising means for providing an output (34) indicative of the simulation process.

8. The simulation system of claim 1 wherein said event manager (46) is adapted to process the simulation model (32) by communicating process commands comprising SendEvent, PostEvent, ScheduleEvent, and BroadcastEvent wherein said simulation specific scripts invoke said commands.

9. A method of conducting simulations comprising:
   defining a simulation model (32) having simulation specific scripts with a Simulation Reference Markup Language (SRML) that is domain specific to simulations;
   communicating said model (32) to a simulation reference simulator (30); executing said model (32) with said simulation reference simulator (30); and
   providing an output (34) of modeled events.

10. The method of claim 9 wherein the step of defining a simulation model (32) includes defining a plurality of items (20) wherein at least one item includes an ItemID and an ItemClass property.

11. The method of claim 10 wherein the step of defining a simulation model (32) includes inputting said items (20) using a host environment (36).

12. The method of claim 10 wherein the step of communicating said model (32) with said simulation reference simulator (30) includes the step of loading each item (20) of said simulation model (32).

13. The method of claim 12 wherein the step of loading includes communicating items with an item manager (44) to an XML parser (54) to build a Document Object Model (DOM) tree for said item.

14. The method of claim 10 wherein at least one item includes an Event property.

15. The method of claim 14 wherein the step of executing said model (32) with said simulation reference simulator (30) includes the step of processing each Event property with an event manager (46).

16. The method of claim 9 wherein the step of executing said model (32) with said simulation reference simulator (30) includes the step of generating random numbers with a random number generator (48).

17. A computer-readable storage medium having computer-readable program code devices embodied therein for simulating events, comprising:
   instructions comprising simulation specific scripts representing a simulation model having a plurality of items wherein each Item (20) represents an article, process or system and includes a Property, said Property including an ItemClass (26) for associating items.

18. The computer-readable medium of claim 17 wherein each Item includes an ItemID defining a script object.

19. The computer-readable medium of claim 17 wherein said Property includes Links to other items.

20. The computer-readable medium of claim 17 wherein said Property includes a Location identifier of the Item.

21. The computer-readable medium of claim 17 wherein said ItemClass (26) is linked to a SuperClass (27) for associating groups of ItemClasses.

22. A computer system for performing simulations comprising:
   a host for providing a simulation model (32) comprising simulation specific scripts;
   a simulation reference simulator for processing said simulation model (32); and
   an output terminal for outputting the process of said simulation model (32).

23. The simulation system of claim 5 wherein said item manager (44) constructs said simulation behavior from said simulation specific scripts specified in an XML and constructs item classes that utilize said DOM tree during simulation execution.

24. The simulation system of claim 1 wherein said simulation reference simulator (30) receives said SRML simulation model comprising at least one item class definition that describes the functionality for similarly named items according to a prescribed inheritance mechanism.

* * * * *